(12) United States Patent
Zheng et al.

(10) Patent No.: US 8,952,532 B2
(45) Date of Patent: Feb. 10, 2015

(54) INTEGRATED CIRCUIT PACKAGE WITH SPATIALLY VARIED SOLDER RESIST OPENING DIMENSION

(71) Applicants: Tieyu Zheng, Redmond, WA (US); Sumit Kumar, Phoenix, AZ (US); Sridhar Nara, San Jose, CA (US); Renee D. Garcia, Gilbert, AZ (US); Manohar S. Konchady, Chandler, AZ (US); Suresh B. Yeruva, Chandler, AZ (US); Lynn H. Chen, Gilbert, AZ (US); Tyler N. Osborn, Gilbert, AZ (US); Sairam Agraharam, Chandler, AZ (US)

(72) Inventors: Tieyu Zheng, Redmond, WA (US); Sumit Kumar, Phoenix, AZ (US); Sridhar Nara, San Jose, CA (US); Renee D. Garcia, Gilbert, AZ (US); Manohar S. Konchady, Chandler, AZ (US); Suresh B. Yeruva, Chandler, AZ (US); Lynn H. Chen, Gilbert, AZ (US); Tyler N. Osborn, Gilbert, AZ (US); Sairam Agraharam, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/893,193

(22) Filed: May 13, 2013

(65) Prior Publication Data
US 2014/0332956 A1 Nov. 13, 2014

(51) Int. Cl.
 *H01L 23/48* (2006.01)
 *H01L 23/498* (2006.01)
 *H01L 21/768* (2006.01)

(52) U.S. Cl.
 CPC .... *H01L 23/49816* (2013.01); *H01L 21/76802* (2013.01); *H01L 21/76885* (2013.01)

USPC .......................................... 257/737; 257/778

(58) Field of Classification Search
 USPC ........................................ 257/737, 738, 778
 See application file for complete search history.

(56) References Cited

U.S. PATENT DOCUMENTS

| | | | |
|---|---|---|---|
| 4,764,804 | A | 8/1988 | Sahara et al. |
| 6,222,277 | B1 | 4/2001 | Downes |
| 6,410,861 | B1 | 6/2002 | Huang et al. |
| 6,415,974 | B2 * | 7/2002 | Jao .................. 228/215 |
| 6,437,439 | B1 | 8/2002 | Shimoe |
| 6,443,351 | B1 | 9/2002 | Huang et al. |
| 6,780,023 | B2 | 8/2004 | Miyagawa |
| 7,084,500 | B2 | 8/2006 | Swnson et al. |
| 7,569,471 | B2 * | 8/2009 | Pang et al. .................. 438/612 |

* cited by examiner

*Primary Examiner* — Roy Potter
(74) *Attorney, Agent, or Firm* — Blakely, Sokoloff, Taylor & Zafman LLP

(57) ABSTRACT

An integrated circuit (IC) package stack with a first and second substrate interconnected by solder further includes solder resist openings (SRO) of mixed lateral dimension are spatially varied across an area of the substrates. In embodiments, SRO dimension is varied between at least two different diameters as a function of an estimated gap between the substrates that is dependent on location within the substrate area. In embodiments where deflection in at least one substrate reduces conformality between the substrates, a varying solder joint height is provided from a fixed volume of solder by reducing the lateral dimensioning of the SRO in regions of larger gap relative to SRO dimensions in regions of smaller gap. In embodiments, the first substrate may be any of an IC chip, package substrate, or interposer while the second substrate may be any of another IC chip, package substrate, interposer, or printed circuit board (PCB).

18 Claims, 8 Drawing Sheets

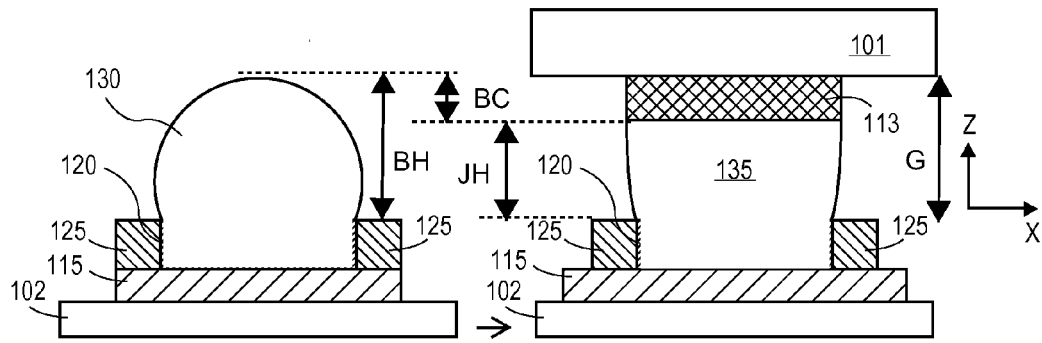
FIG. 1A  FIG. 1B
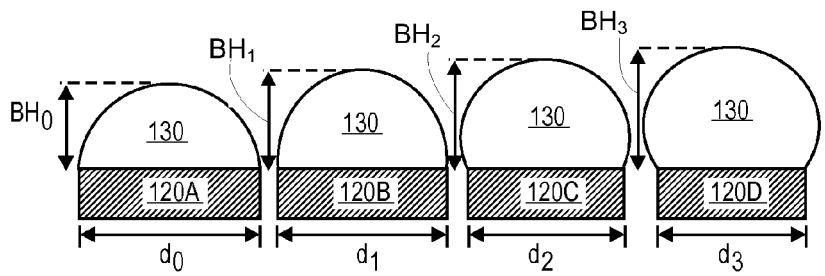
FIG. 1C
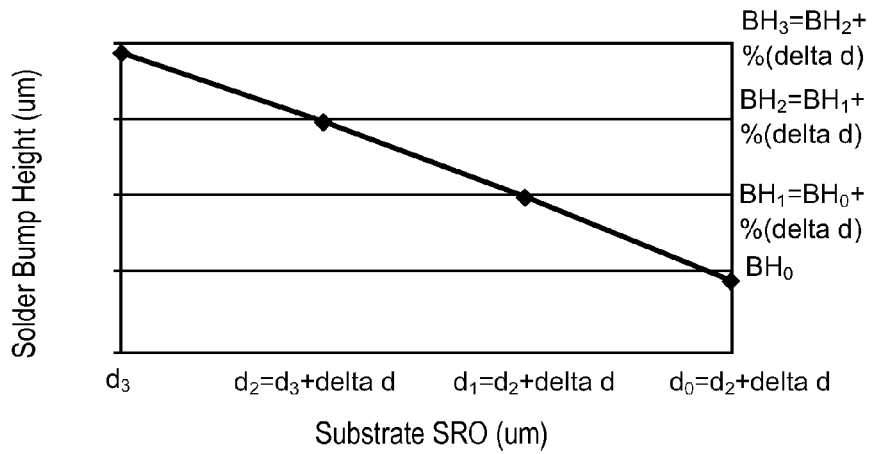
Solder bump height vs. substrate SRO
FIG. 1D

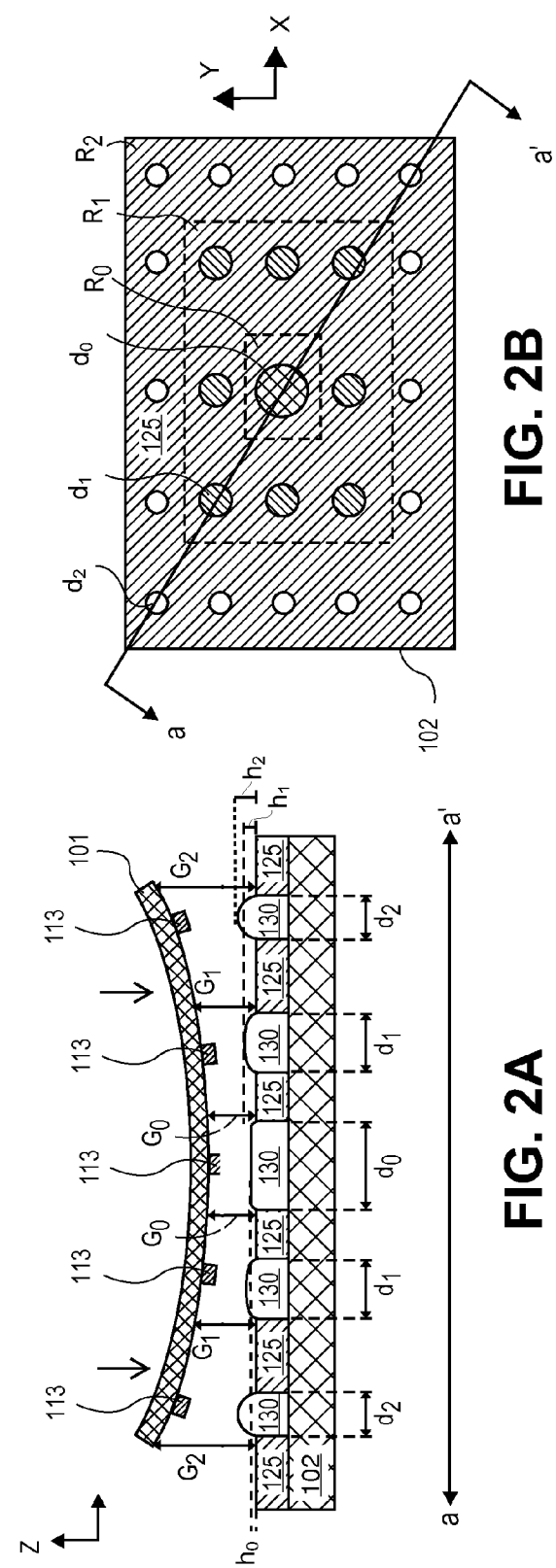

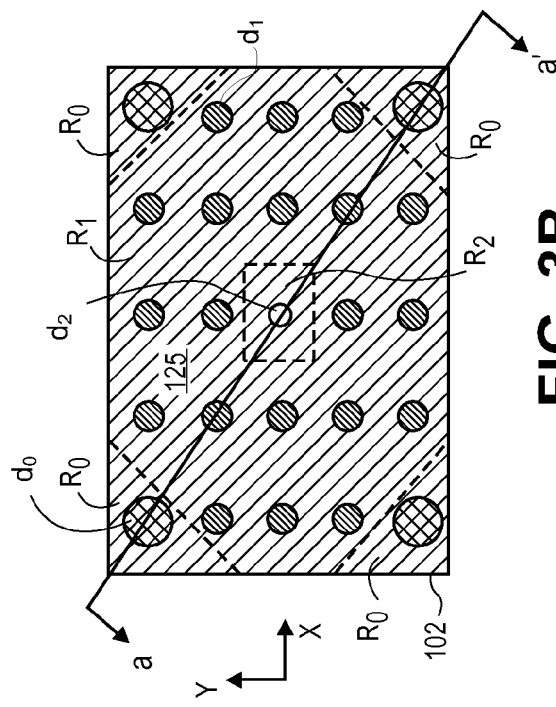
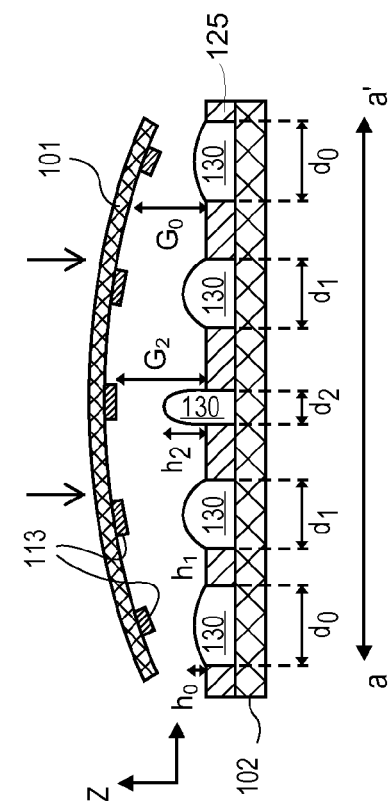
FIG. 3B
FIG. 3A

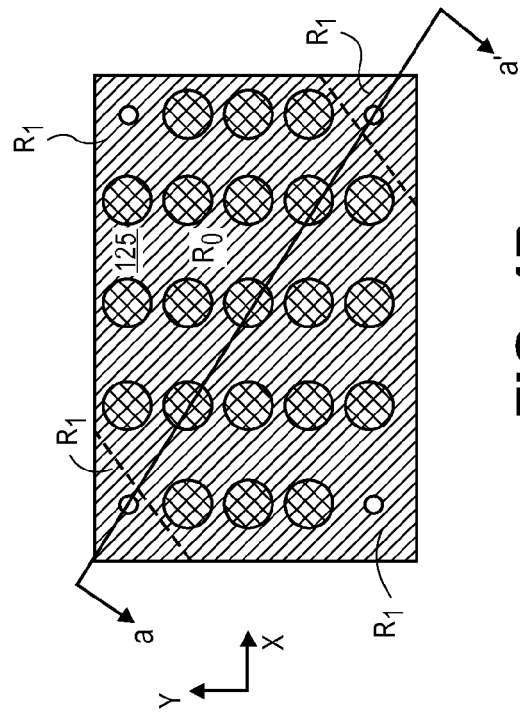
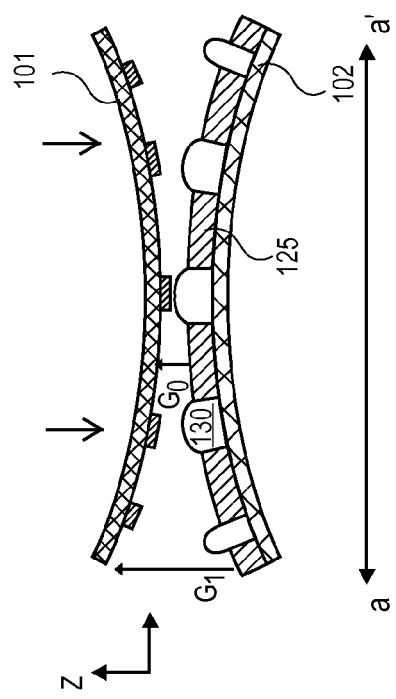
FIG. 4B
FIG. 4A

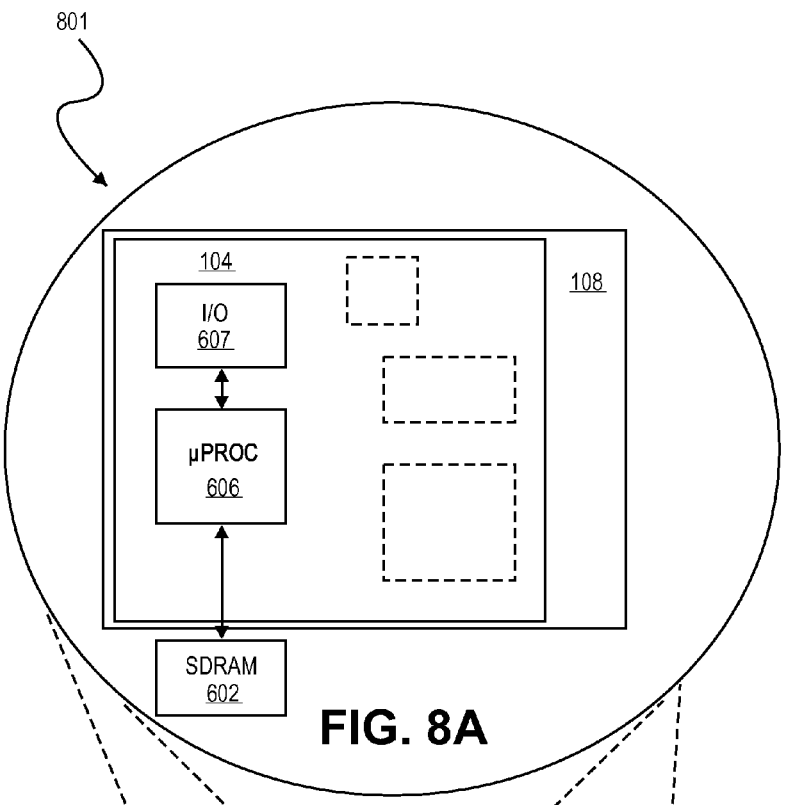
FIG. 8A
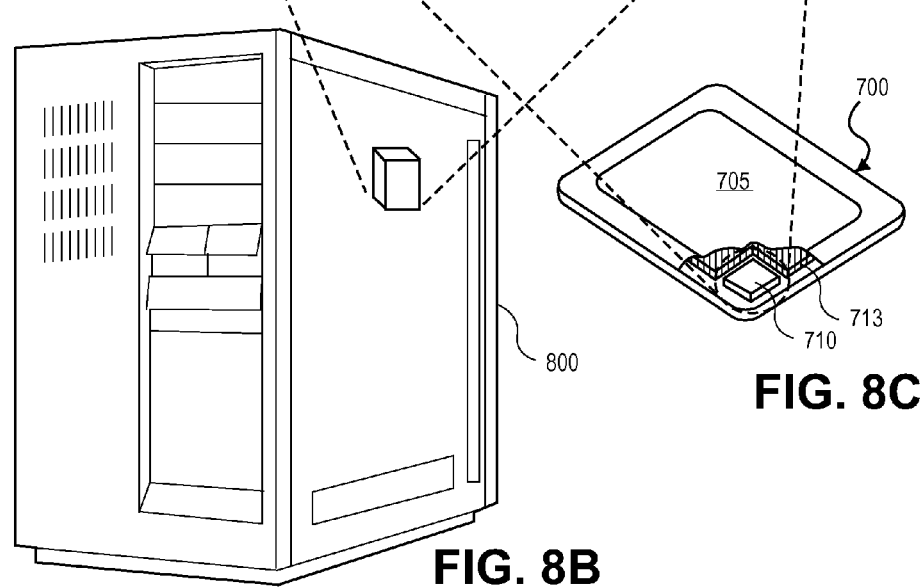
FIG. 8B
FIG. 8C

INTEGRATED CIRCUIT PACKAGE WITH SPATIALLY VARIED SOLDER RESIST OPENING DIMENSION

TECHNICAL FIELD

Embodiments of the present invention generally pertain to integrated circuits (ICs), and more particularly to IC chip solder interconnections.

BACKGROUND

Lighter and thinner computing platforms are being designed, driving a reduction of package thickness, including both IC chip, or die, thickness and package substrate thickness. Concurrently, greater reliance on Internet data storage and cloud computing is driving server computers toward larger die sizes. For example, for a packaged processor may house a silicon die of approximately 33×22 mm. During packaging, thinner and/or larger die suffer greater die deflection at a given solder reflow temperature. A thinner package substrate, non-uniform metallization density across the substrate stack-up, and larger area all act to increase the substrate deflection. Therefore, gaps between the die and a package substrate may increase during chip attach process (module), resulting in more non-contact open (NCO) failures, thus impacting the assembly yield.

Various solutions are being researched to improve the chip attach yield. Glass cloth in buildup layers, for example, may be employed to reduce the substrate deflection during chip attach reflow. Bump flattening may also be employed to reduce incoming package deflection and facilitate better contact between solder bumps and die bumps in order to improve chip attach yield. High modulus core materials have also been investigated for package substrates, but these materials possess uncertainty with respect to package reliability and pose an issue for electrical signal integrity if placed near routing layers within substrate. All these methods add processing cost to the substrate and have thus far not succeeded in completely eliminating NCO yield loss with NCO often still posing the greatest yield loss issue.

A robust solution providing significant margin for NCO that can be implemented easily across multiple products without adding significant substrate cost is therefore advantageous.

BRIEF DESCRIPTION OF THE DRAWINGS

Embodiments of the present invention are illustrated by way of example, and not limitation, in the figures of the accompanying drawings, which are deliberately drawn out of scale so as to emphasize specific technical features. In the drawings:

FIG. 1A is a cross-sectional view of a solder bump disposed on a metal surface within a SRO on a first substrate, in accordance with an embodiment of the present invention;

FIG. 1B is a cross-sectional view of a solder joint between two substrates formed with the solder bump of FIG. 1A;

FIG. 1C is a cross-sectional view of a plurality of solder bumps depicting a varying bump height as dependent on a varied SRO dimension, in accordance with embodiments of the present invention;

FIG. 1D is a plot of bump height as a function of SRO dimension for an exemplary embodiment of the present invention;

FIGS. 2A, 3A, and 4A are cross-sectional views of SRO dimensions varied as a function of conformality of the substrates to be solder joined, in accordance with embodiments of the present invention;

FIGS. 2B, 3B, and 4B are plan views illustrating solder bumps disposed within a plurality of SRO having exemplary spatial distributions across a substrate based on the conformality of the substrates illustrated in FIGS. 2A, 3A, and 4A, respectively, in accordance with embodiments of the present invention;

FIG. 8A is a plan view schematic of a system including an IC package stack in accordance with an embodiment;

FIG. 8B is an isometric view of a server machine employing the system of FIG. 8A, in accordance with an embodiment; and FIG. 8C is an isometric view of a mobile computing device employing the system of FIG. 8A, in accordance with an embodiment.

DETAILED DESCRIPTION

Figure 5A:
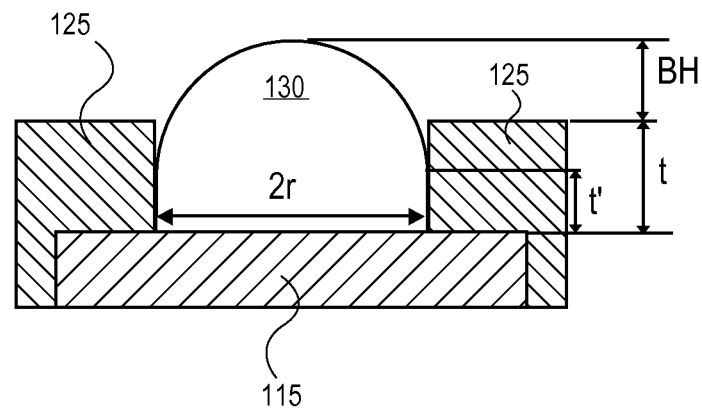
FIG. 5A is a cross-sectional view of a solder bump in accordance with a first level interconnect embodiment of the present invention.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not structurally or functionally exclusive of the other.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship).

Generally, to facilitate contact for a solder joint, embodiments herein increase the solder bump height in areas of large substrate gap (e.g., between an IC chip and a package substrate) relative to bump heights in areas where there is a smaller gap. In further embodiments described herein, solder resist opening (SRO) diameters are varied over the area of a substrate, such as a package substrate, to modulate solder bump heights within the area that is to be joined to another substrate, such as an IC chip. In certain embodiments, solder bump height profile is spatially modulated to correspond to a spatial gap profile associated with a pair of substrates to be joined, improving the probability that a solder bump at a given location within jointing area will make contact with its land during reflow. Advantageous implementations of this technique have been found by the inventors to reduce NCO failure and improve yield in solder interconnect processes, such as chip attach, or surface mount.

FIG. 1A is a cross-sectional view of a solder bump 130 in a reflowed state disposed on a metal surface of a substrate 102 within a SRO 120, in accordance with an embodiment of the present invention. Generally, the metal surface onto which the solder bump 130 is disposed may be any metal surface left exposed by the solder resist 120 that covers the remainder of the substrate 102. In the exemplary solder-mask-defined (SMD) embodiment depicted, a patterned copper pad 115 is disposed on a side of the substrate 102 with the solder resist defining the SRO 120 over a portion of the copper pad 115. A surface finish may further be present within the SRO 120 or over the entire top surface of the copper pad 115. For a given volume of solder that is dependent on the size of solder ball applied, the solder bump 130 is associated with a particular diameter d. The bump 130 is further associated with a bump height BH, as measured from a top of the solder resist 120 to a top of the solder bump.

FIG. 1B is a cross-sectional view of a solder joint 135 between the substrate 102 and another substrate 101 formed with the substrate 101 is brought into contact with the reflowed solder bump 130 depicted in FIG. 1A. As shown, the solder joint 135 has a solder joint height JH, as measured between a metal surface of the substrate 101 to the top surface of the solder resist 125. In the exemplary embodiment depicted, the metal surface interfacing with the solder joint 135 is a top surface of a metallization bump 113 protruding from the substrate 101. Such metallization bumps are often in the form of cylindrical pillars or studs, although other forms are possible, and are typically of copper. A surface finish may also be present on the metallization bump 113.

For a successful interconnect, the combination of the solder joint 135 and the metallization bump 113 spans a gap G between the substrates 101, 102, as measured from a top of the solder resist 125 to a base of the bump 113. Die deflection, substrate die-shadow deflection, and uncontrolled die bump height variation may render the gap G non-uniform across an area of a substrate to be occupied by multiple solder joints. When a melted solder bump 130 touches and wets on the bumps 113 during reflow, both surface tension and pressure from melted solder act on the metallization bump 113 and are functions of the gap G at each joint location. Generally, stretched solder promotes joint collapse towards the substrate while bulged solder resists collapse. The collapse stops the at the so-called "free collapse height," where the collapsing forces at certain joints are balanced by the resistance at other joints. The solder joint 135 illustrates a good joint after a free bump collapse BC that is equal to bump height BH minus the joint height JH (BC=BH−JH). Conversely, an NCO occurs if a solder bump does not touch its die bump, which can result where the solder joint surface energy becomes larger than the solder bump surface energy and a joint is broken in favor of the lower energy state of the bump form.

In embodiments, a lateral dimension of SRO is varied over an area of a substrate. Depending on the embodiment, a substrate includes SRO of at least two different diameters, and may further include SRO of a third, a fourth, or more, different diameters. FIG. 1C is a cross-sectional view of a plurality of solder bumps depicting varying bump height as dependent on a varied SRO dimension, in accordance with embodiments of the present invention. In FIG. 1C, a wall of the SRO 120A, 120B, 120C, and 120D are illustrated without surrounding solder resist for the sake of clarity. Four different SRO diameters $d_0$-$d_3$ are also illustrated for completeness, but as few as two different SRO diameters may be employed on a given substrate. In FIG. 1C, the solder volume is the same all four bumps illustrated (i.e., the bumps 130 result from reflowing (micro) solder balls of substantially the same diameter). For a given solder volume, the solder bump height varies from a shortest bump height $BH_0$ for an SRO 120A having a largest lateral dimension $d_0$ to a tallest bump height $BH_3$ for an SRO 120D having a smallest lateral dimension $d_3$. A plot of bump height from FIG. 1C, including the bump heights $BH_1$ and $BH_2$, is shown in FIG. 1D. The bump heights illustrate a clear dependence on SRO dimension for one exemplary embodiment of the present invention where a fixed increment in lateral dimension of the SRO ($\Delta d$) increases the bump height by 50-100% of $\Delta d$. Thus, in one exemplary embodiment where $\Delta d$ is 5-10% of the smallest lateral SRO dimension $d_3$, the bump height increments from 2.5-10% of the SRO dimension $d_3$ between each of 120A, 120B, 120C, and 120D.

Solder joint collapse is a complex function of a number of variables such as, but not limited to, solder volume, solder surface tension, contact angle between liquid solder and solidified surfaces, dimensions of the metallization bump 113, and dimension of the SRO 120. The inventors have determined however that when two joints of different SRO dimension collapse concurrently, collapse resistance builds within joint(s) with the smaller SRO earlier than for the joint(s) with larger SRO dimension and therefore resist the collapse of the joints(s) with larger SRO dimensions. Hence, mixed-dimensioned SRO in accordance with embodiments induce different forces on a metallization bump as a function of the joint height. In the exemplary embodiments where the joint height is varied as a function of a spatially varying gap profile between substrates, bump collapse varies across the area of the substrates in a manner that has been found to reduce NCO failures. This is in contrast to the effect of ball size, for example, where a larger solder ball diameter increases solder bump height for a given SRO diameter, but bump collapse is unaffected such that NCO failures remain.

In embodiments, SRO diameters of varying dimension are spatially arranged over an area of the substrate based on an expected, estimated, or otherwise predetermined z-height gap between two substrates to be joined. In other words, the SRO diameters follow a spatial distribution function across an area of a substrate with the function being dependent on conformality of the first substrate to the second substrate. Generally, this spatial distribution is to locate SRO of larger diameter within a region of smaller gap between the first and second substrates so that the smaller bump height is co-located with the smaller gap while the second SRO of smaller diameter is co-located with a larger gap between the first and second substrates.

FIGS. 2A, 3A, and 4A are cross-sectional views of SRO dimensions varied as a function of conformality of the substrates 101, 102 to be solder joined. In the FIGS. 2A, 3A, and 4A the substrates are being brought toward each other (denoted by the arrows), but are not yet joined. FIGS. 2B, 3B, and 4B are plan views illustrating solder bumps disposed within a plurality of SRO having exemplary spatial distributions across a shadowed region of the substrate 102 corresponding to where the substrate 101 is to land. The spatial distributions of mixed-dimensioned SRO are based on the z-dimension conformality of the substrates 101, 102 illustrated in FIGS. 2A, 3A, and 4A, respectively, in accordance with embodiments of the present invention.

As shown in FIG. 2A, the substrate 102 includes SRO of three different lateral diameters $d_0$, $d_1$, and $d_2$ formed in the solder resist 125. Reflowed solder 130 of a given volume is disposed in each SRO resulting in three different solder bump z-heights $h_0$, $h_1$, and $h_2$ distributed along a length of the cross-sectional plane a-a'. As further depicted, the substrate 101 is deflected in the z-dimension such that a convex z-dimension gap profile varies from a smallest gap $G_0$ proximate to a center of the substrate 101 and/or 102, a largest gap $G_2$ proximate to a periphery of the substrate 101 and/or 102, and an intermediate gap $G_1$ disposed there between. As illustrated in both FIGS. 2A and 2B, the SRO are spatially distributed to have the solder bump z-height best match, or follow, the substrate gap profile. More specifically, the SRO of largest diameter $d_0$ is(are) disposed proximate to the center of the substrate 101 is to land while the SRO of smallest diameter $d_2$ is(are) disposed proximate to the periphery of the substrate 101 (102). As illustrated in FIG. 2B, the spatial distribution of the mixed-diameter SRO within the x-y plane is a function of both the x-dimension and the y-dimension, forming three distinct "picture frame" zones or regions $R_0$, $R_1$ and $R_2$ within the substrate 102, denoted by dashed lines. Within each region (e.g., $R_0$) SRO have a particular diameter (e.g., largest). As shown for this exemplary embodiment, SRO diameter is a function of distance (e.g., radial, mean squared, etc.) from the center of the joining substrates 101, 102 so that a third solder joint, disposed more proximate to a corner of the second substrate than is either the first or second solder joint, contacts a metal surface of the second substrate within a third SRO that is smaller ($d_2$) than either the first or second SRO ($d_0$, $d_1$). In other words, SRO diameters decreases with increasing proximity to the region of the second substrate that is to be joined to corners of the substrate 101.

FIG. 3A illustrates a z-dimension gap profile between two substrates that is the inverse of that illustrated in FIG. 2A. As shown in this exemplary embodiment, the SRO are again spatially distributed to have the solder bump z-height best match or follow the concave substrate gap profile with the SRO of largest diameter $d_0$ disposed proximate to the periphery of the substrates and SRO of smallest diameter $d_2$ disposed proximate to the center of the substrates. FIG. 3B further illustrates the mixed-diameter SRO layout within the x-y dimension in which corners of the die (e.g., triangular regions $R_0$) have one SRO diameter (e.g., $d_0$), while a second region (e.g., $R_1$) within the substrate 102 where an edge of the substrate 101 will land has SRO of a second, different diameter (e.g., $d_1$). A third region (e.g., $R_2$), proximate a center of the joining substrates has a third SRO diameter (e.g., d2). Here too, the three SRO diameters are illustrative of the technique and not limiting with respect to the number of different SRO diameters present over an area of a substrate as this number may two or more, as desired.

FIGS. 4A and 4B further illustrate how the z-gap profile may be a function of deflection present in both substrates 101 and 102, for example where both substrates are aggressively thinned. Here, the SRO diameters vary as a function of the net deflection between two substrates. For the embodiment illustrated in FIGS. 4A and 4B there are only two different SRO diameters arranged into two regions $R_0$ and $R_1$ over the x-y dimensional area of the substrate 102 that receives the substrate 101.

Generally, embodiments of the present invention are applicable to any substrates joined by solder that employ a solder resist mask. In one exemplary embodiment, a first substrate is an IC chip or die, while the second substrate is a package substrate. In such an embodiment, the solder bump may be referred to as a first level interconnect (FLI), and the joining actions depicted in FIGS. 2A-4A represent chip attachment. In other embodiments where the first substrate is an IC chip, the second substrate may also be a second IC chip, forming a 3DIC, for example. In another exemplary embodiment, the first substrate is a package substrate or an interposer, while the second substrate is an interposer or a printed circuit board (PCB). In such an embodiment, the solder bump may be referred to as middle level interconnect (MLI), and second level interconnect (SLI), respectively, and the joining actions depicted in FIGS. 2A-4A then represent surface mounting.

Figure 5B:
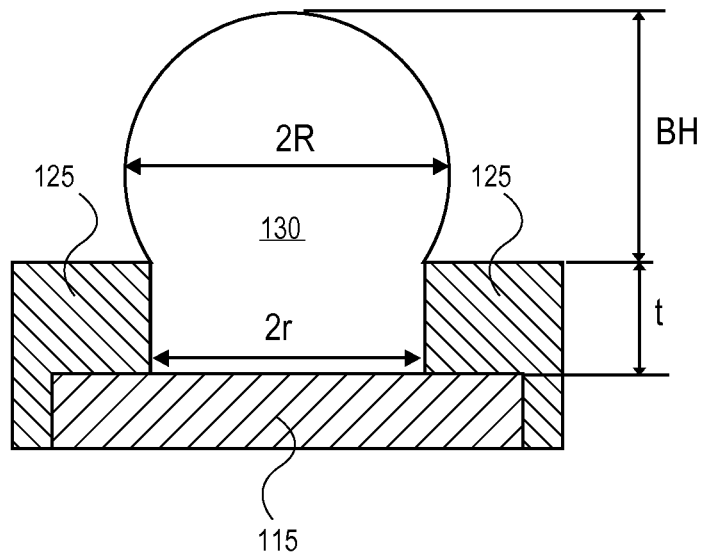
FIG. 5B is a cross-sectional view of a solder bump in accordance with a second level interconnect embodiment of the present invention.

Notably, solder ball size varies considerably between FLI, MLI, and SLI embodiments. For example, FIG. 5A is a cross-sectional view of a solder bump in accordance with a FLI embodiment of the present invention while FIG. 5B is a cross-sectional view of a solder bump in accordance with a SLI embodiment of the present invention. As shown in FIGS. 5A and 5B, solder resist of a given thickness, t (e.g., ~20 µm) corresponds to a greater portion of the solder volume of a reflowed micro ball having a diameter of 2r (e.g., 50 µm) than it does for a solder ball of significantly greater diameter 2R (e.g., 400 mil). As such, variations in the SRO diameter may drive greater variations in solder bump z-height BH for an FLI embodiment than for a SLI embodiment. For example, where the change in solder bump height BH may range from 50-100% of a SRO diameter change for a FLI embodiment, the change in solder bump height BH may range from 10-20% of a SRO diameter change for a SLI embodiment. Thus, SRO diameters in SLI embodiments may have a greater (%) variation than do FLI embodiments to sufficiently accommodate a gap profile. For example, FLI embodiments may have a SRO diameter range that is at least 5% of the smallest diameter (e.g., 60 µm), and advantageously 6%-8% (e.g., ~5 µm), while SLI embodiments may have a SRO diameter range that is at least 10% of the smallest diameter (e.g., 400 µm), and advantageously 12-15%. Ranges much beyond these potentially pose manufacturing issues resulting from solder balls failing to make contact with the metal surfaces, or reliability issues relating to a higher resistances for the interconnect with the smallest SRO diameter. Such manufacturing issues however may be mitigated, for example with reduced solder resist thickness, so that a larger SRO dimension variation is conceivable. Similarly, such resistance issues may be more of a consideration where the spatial distribution of mixed-dimensioned SRO is such that the joints with minimum SRO diameter provide power connections between the two substrates. Indeed, in some embodiments where an edge row of solder joints in a package carry power while interior solder joints carry I/O signals, the SRO dimension for the power connections may be smaller than the SRO dimension for the I/O connections if, for example, a concave substrate results in a larger gap at the edge where the power connections are located. Notably, this specific spatial distribution would be the opposite of that of an SRO dimensional distribution designed merely to accommodate solder balls of varying volumes.

Figure 6A:
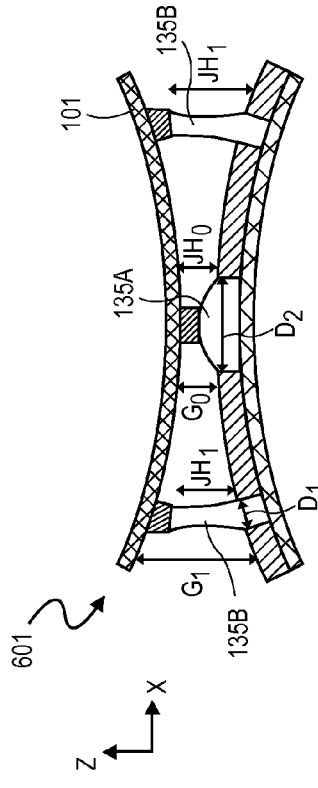
FIG. 6A is a cross-sectional view of an IC package stack including two substrates, in accordance with an embodiment.

FIG. 6A is a cross-sectional view of an IC package stack 601 including two substrates, in accordance with an embodiment. FIG. 6A illustrates a stack-up after the solder bumps having certain z-height distributions, for example as was illustrated in FIG. 4A, are formed into solder joints 135A, 135B. For the exemplary embodiments, the solder joints in the stack 601 are of substantially the same solder volume (i.e., within the typical variation of a solder dispense process targeting a fixed volume). The first substrate 101 (e.g., an IC chip including a silicon semiconductor substrate having a thickness less than 350 µm, and at least one edge length exceeding 30 mm) is joined to a second substrate 104 (e.g., a package substrate) having a plurality of SRO of mixed dimension $d_0$ and $d_1$ with the larger dimension $d_0$ disposed in the region of smallest z-dimension gap $G_0$ and the smaller dimension $d_1$ disposed in the region of larger gap $G_1$. The solder joint 135A of a lower joint height $JH_0$, and solder joint 135B of a taller joint height $JH_1$ (e.g., at least 5 µm greater than $JH_0$), interconnect the substrates 101, 102 following the controlled collapse.

Figure 6B:
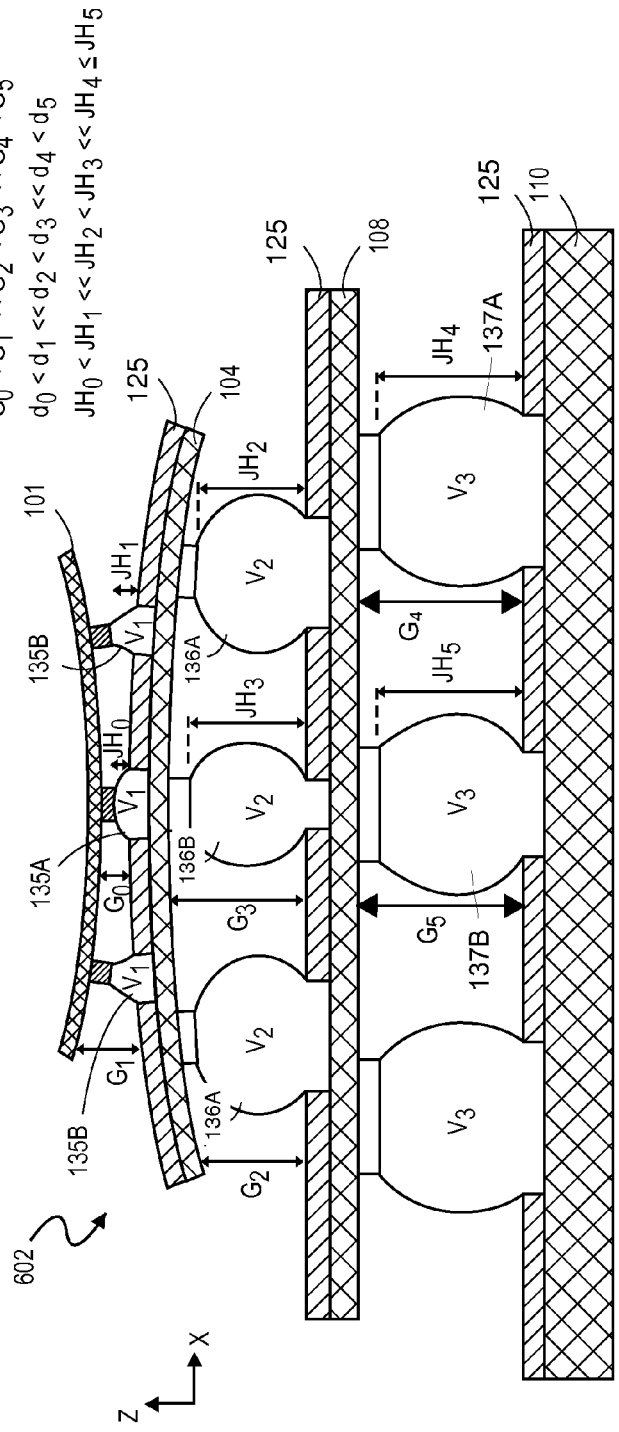
FIG. 6B is a cross-sectional view of an IC package stack including four joined substrates, in accordance with an embodiment.

While the substrates illustrated in the stack 601 may be any of an IC chip, package substrate, interposer, or PCB, it is further noted that more than a pair of substrates may be successively joined with mixed-dimensioned SRO present at multiple interconnect levels of a particular package. In other words, more than one of a FLI, MLI, and SLI may employ mixed-dimension SRO spatially arranged to accommodate different gap profiles present between different substrates within the stack. FIG. 6B is a cross-sectional view of an IC package stack 602 including four joined substrates 101, 104, 108 and 110, in accordance with an embodiment. As shown, the substrates 101, 104 making up the stack 601 are further joined to an interposer 108 and a PCB 110. Just as the FLI solder joints 135A and 135B are of essentially a same solder joint volume $V_1$ the MLI solder joints 136A, 136B are of essentially the same volume $V_2$ and SLI solder joints 137A, 137B are of essentially the same volume $V_3$ with the nominal solder volume generally increasing for each interconnect level (i.e., $V_1<V_2<V_3$). While smaller diameter SRO were spatially distributed to regions of the substrate 104 proximate to edges of the substrate 101, convex deflection in the substrate 104 is accommodated by spatially distributing SRO of smaller diameter $d_3$ to regions of the substrate 108 proximate the center of the substrate 104.

Notably, even where two joined substrates are co-planar, or very nearly co-planar, and the z-gap profile is constant, or very nearly constant, as a function of x-y position on a substrate, mixed SRO may still be employed to reduce probability of an NCO failure where there ordinary process variation may, on occasion, introduce significant non-conformality that would otherwise make an NCO failure more likely. This situation is illustrated in FIG. 6B where the substrates 108 and 110 are depicted as being substantially co-planar, but different SRO dimensions $d_4$ and $d_5$ remain significant and discernable. If a given pair of substrates 108, 110 are in-fact coplanar, then gaps $G_4$ and $G_5$ are essentially equal, as well as the joint heights $JH_4$ and $JH_5$. However, the bump collapse remains a function of the mixed dimension SRO and the ability for these joints to accommodate process variation inducing substrate non-conformality will be improved.

Figure 7:
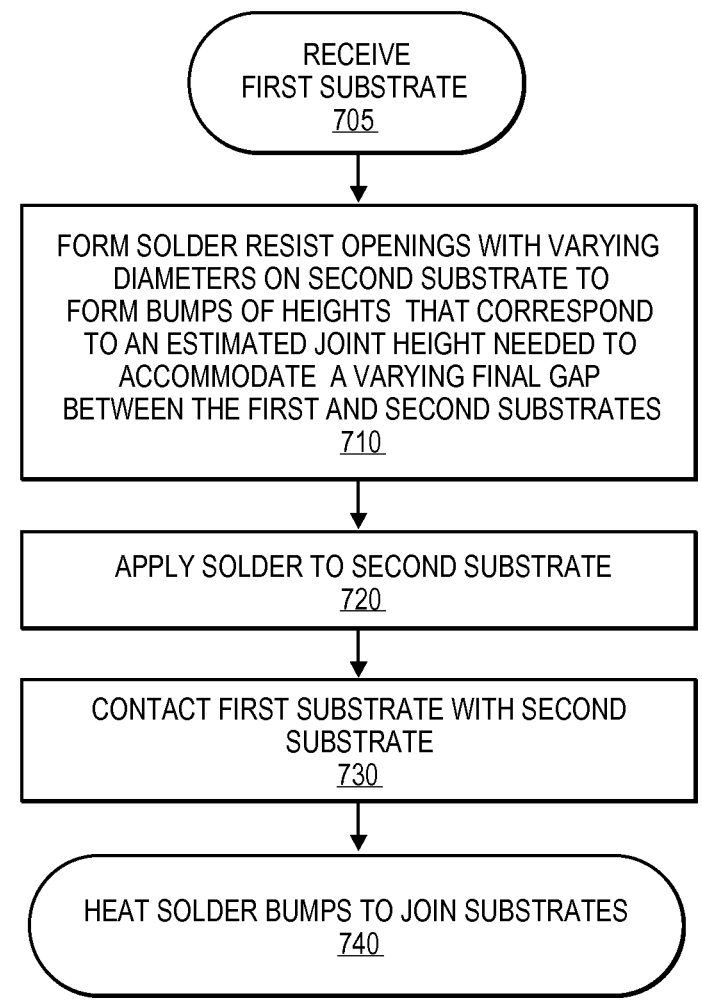
FIG. 7 is a flow diagram illustrating a method of joining two substrates with mixed SRO to form an IC package stack, in accordance with an embodiment.

FIG. 7 is a flow diagram illustrating a method 701 for joining two substrates with mixed-dimensioned SRO to form an IC package stack, in accordance with an embodiment. The method 701 begins at operation 705 where a first substrate, such as an IC chip, is received. At operation 710, solder resist openings (SRO) on at least one of the two substrates to be joined, such as a package substrate, are formed with diameters that vary as a function of an estimated gap profile spanning multiple locations between the first and second substrates. Estimation of the gap may be based on a predetermined empirical or theoretical model developed for the class of substrates in question, or it may be accessed (measured) for each substrate pairing. Collapse may further be estimated as a function of location within an area of at least one of the substrates at operation 710 (e.g., by computation fluid dynamics, or a surface energy evolver) for a given SRO dimensional mix or spatial layout. Operation 710 may therefore entail an iterative calculation to arrive at a bump height spatial distribution that corresponds to solder joint heights suitable for accommodating the spatially varying final gap the between joined substrates. A solder resist is then formed by any conventional means to have the desired spatial arrangement of the mixed-dimension SRO.

At operation 720, solder is applied to the substrate having the SRO using any conventional means. For example, flux may be applied and micro balls may be mounted. Reflow and de-flux are then performed. At operation 730, the two substrates to be joined are then brought together such that metallization bumps on one contact the solder bumps of the other. The solder is then heated/reflowed at operation 740 to interconnect/join the two substrates with solder joints of varying height.

FIG. 8A is a functional block diagram of a system employing a packaged IC with mixed-dimensioned SRO, in accordance with an embodiment. FIG. 8B is an isometric view of a server machine employing the system of FIG. 8A, in accordance with an embodiment. FIG. 8C is an isometric view of a mobile computing device employing the system of FIG. 8A, in accordance with an embodiment. Reference numbers in FIGS. 8A, 8B, and 8C are deliberately the same as those used elsewhere herein for those elements/components that may have any of the features previously described in the context of that same reference number.

Referring to FIG. 8A, in one exemplary embodiment the IC chip 104 includes the logic processor core 606, and may be for example a central processing unit (CPU). In an exemplary embodiment, the logic processor core 606 is communicatively coupled to at least one input/output (I/O) interface 607 (e.g., USB, SATA, PCIe, etc.) and is further coupled to a memory 602 (e.g., DDR SDRAM), for example provided on a motherboard of the system 801. In other embodiments, the IC chip 104 is a system-on-a-chip (SoC) including a wireless (RF) module as well as the at least one logic processor core 606. In embodiments, at least one of the memory 602 or logic processor core 606 is packaged with mixed-dimensioned SRO, as described elsewhere herein.

FIG. 8B is an isometric view of a server machine 800 employing the system 801, in accordance with an embodiment. The server machine 800 may be any computing 801 device configured for data processing and include one or more microprocessor IC chips and one or more memory modules (e.g., SDRAM). In embodiments, mixed-dimensioned SRO packaging enables larger dimensions of the microprocessor IC chip(s) (e.g., over 30 mm on a side,) and/or thickness of the IC chip(s) or package substrate(s) reduced (e.g., below 350 µm) to increase functionality of the server machine 800.

FIG. 8C is an isometric view of a mobile computing device 700 employing the system 801, in accordance with an embodiment. The mobile computing device or platform 700 may be any portable device configured for each of electronic data display, electronic data processing, and wireless electronic data transmission. For example, the mobile computing device 700 may be any of a tablet, a smart phone, laptop computer, other intent device, etc. and includes a display screen 705, the system 501, and a battery 713. In embodiments, mixed-dimensioned SRO packaging enables the form factor of the packaged system 710 to be reduced relative to systems relying only on conventional package technology.

Integrated circuit (IC) package stacks including inventive attributes have therefore been described. For example, where an IC stack includes a first substrate, a second substrate having a plurality of solder resist openings (SRO), and a plurality of solder joints interconnecting the first and second substrates, the plurality of solder joints include both a first joint of a first height contacting a metal surface disposed on the second substrate within a first SRO of a first diameter, and a second joint of a second height, greater than the first, contacting a metal surface disposed on the second substrate within a second SRO of a second diameter, smaller than the first diameter.

In further embodiments, the first and second joints have substantially the same solder volume, and the first and second diameters vary by at least 5%.

In further embodiments, the first substrate is an IC chip and the second substrate is one of a package substrate, an interposer, another IC chip, or a printed circuit board (PCB), or the first substrate is one of a package substrate or interposer and the second substrate is a PCB.

In further embodiments, the first substrate is an IC chip, the first and second SRO diameters differ by at least 5% of the second diameter, or wherein the first substrate is a package substrate or an interposer and the first and second SRO diameters differ by at least 10% of the second diameter.

In further embodiments, SRO diameters in the plurality follow a spatial distribution function across an area of the second substrate.

In further embodiments, the spatial distribution function is dependent on conformality between the first and second substrate, and the first SRO of larger diameter is co-located with a smaller gap between the first and second substrates while the second SRO of smaller diameter is co-located with a larger gap between the first and second substrates.

In further embodiments, the first solder joint is disposed proximate to a center of the second substrate area and wherein the second solder joint is disposed proximate to a periphery of the second substrate area.

In further embodiments, a third solder joint disposed more proximate to a corner of the second substrate than is either the first or second solder joint contacts a metal surface of the second substrate within a third SRO that is smaller than either the first or second SRO.

In further embodiments, the first solder joint is to carry an I/O signal between the first and second substrates and the second solder joint is to carry power between the first and second substrates.

In embodiments where an integrated circuit (IC) package stack, include a first substrate and a second substrate having a plurality of solder resist openings (SRO), diameters of the SRO vary across an area of the second substrate with smaller SRO diameters disposed in regions of larger gap between the first and second substrate; and a plurality of solder joints disposed within the plurality of SRO interconnect the first and second substrates.

In further embodiments, the SRO diameter is dependent on both a first and second dimension of the second substrate.

In further embodiments, the SRO diameters decrease with increasing proximity to corners of the second substrate.

In further embodiments, the plurality of solder joints have substantially the same solder volume, and wherein the SRO diameters vary by more than 5% of at least one of the SRO diameters.

In further embodiments, the first substrate is an IC chip and the second substrate is one of a package substrate, an interposer, another IC chip, or a printed circuit board (PCB), or wherein the first substrate is a PCB and the second substrate is one of a package substrate or interposer, and the SRO diameters vary by more than 10% of at least one of the SRO diameters.

In embodiments where a method of assembling an integrated circuit (IC) package stack including a first and second substrate interconnected by solder includes forming solder resist openings (SRO) on the first substrate, the SRO are formed with diameters that vary as a function of an estimated gap between the first and second substrates. Solder is applied to the first substrate, the second substrate is brought into contact with the solder; and the solder heated to join the substrates.

In further embodiments, the SRO diameters are varied by at least 5%; and applying the solder further comprises depositing solder balls of a fixed volume in the SRO openings of varying diameter.

In further embodiments, the gap between the first and the second substrate is estimated as a function of location within the first substrate.

In further embodiments, the first substrate is an IC chip and the second substrate is one of a package substrate, an interposer, another IC chip, or a printed circuit board (PCB), or wherein the first substrate is a PCB and the second substrate is one of a package substrate or interposer, and the SRO diameters vary by more than 10%.

In further embodiments, the first substrate is an IC chip comprising a silicon semiconductor substrate having a thickness less than 350 μm, and at least one edge length exceeding 30 mm.

In further embodiments, the second substrate is one of a package substrate or an interposer and heating the solder further comprises forming a plurality of solder joints that vary in height by at least 5 μm.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An integrated circuit (IC) package stack, comprising:
 a first substrate;
 a second substrate having a plurality of solder resist openings (SRO); and
 a plurality of solder joints interconnecting the first and second substrates, wherein the plurality of solder joints include:
 a first joint of a first height contacting a metal surface disposed on the second substrate within a first SRO of a first diameter; and
 a second joint of a second height, greater than the first, contacting a metal surface disposed on the second substrate within a second SRO of a second diameter, smaller than the first diameter.

2. The stack of claim 1, wherein the first and second joints have substantially the same solder volume, and wherein the first and second diameters vary by at least 5%.

3. The stack of claim 2, wherein the first substrate is an IC chip and the second substrate is one of a package substrate, an interposer, another IC chip, or a printed circuit board (PCB), or wherein the first substrate is one of a package substrate or interposer and the second substrate is a PCB.

4. The stack of claim 3, wherein the first substrate is an IC chip, the first and second SRO diameters differ by at least 5% of the second diameter, or wherein the first substrate is a package substrate or an interposer and the first and second SRO diameters differ by at least 10% of the second diameter.

5. The stack of claim 1, wherein SRO diameters in the plurality follow a spatial distribution function across an area of the second substrate.

6. The stack of claim 5, wherein the spatial distribution function is dependent on conformality between the first and second substrate with the first SRO of larger diameter co-located with a smaller gap between the first and second substrates while the second SRO of smaller diameter is co-located with a larger gap between the first and second substrates.

7. The stack of claim 6, wherein the first solder joint is disposed proximate to a center of the second substrate area and wherein the second solder joint is disposed proximate to a periphery of the second substrate area.

8. The stack of claim 7, wherein a third solder joint disposed more proximate to a corner of the second substrate than is either the first or second solder joint contacts a metal surface of the second substrate within a third SRO that is smaller than either the first or second SRO.

9. The stack of claim 7, wherein the first solder joint is to carry an I/O signal between the first and second substrates and the second solder joint is to carry power between the first and second substrates.

10. An integrated circuit (IC) package stack, comprising:
a first substrate;
a second substrate having a plurality of solder resist openings (SRO), wherein diameters of the SRO vary across an area of the second substrate with smaller SRO diameters disposed in regions of larger gap between the first and second substrate; and
a plurality of solder joints disposed within the plurality of SRO interconnecting the first and second substrates.

11. The stack of claim 10, wherein the SRO diameter is dependent on both a first and second dimension of the second substrate.

12. The stack of claim 11, wherein the SRO diameters decrease with increasing proximity to corners of the second substrate.

13. The stack of claim 10, wherein the plurality of solder joints have substantially the same solder volume, and wherein the SRO diameters vary by more than 5% of at least one of the SRO diameters.

14. The stack of claim 13, wherein the first substrate is an IC chip and the second substrate is one of a package substrate, an interposer, another IC chip, or a printed circuit board (PCB), or wherein the first substrate is a PCB and the second substrate is one of a package substrate or interposer, and the SRO diameters vary by more than 10% of at least one of the SRO diameters.

15. The stack of claim 1, further comprising an intermediate joint of a third height, greater than the first height but less than the second height, contacting a metal surface disposed on the second substrate within a third SRO of a third diameter, smaller than the first diameter but larger than the second diameter.

16. The stack of claim 15, wherein the third joint is in between the first and second joints.

17. The stack of claim 16, wherein the first, second, and third heights follow a concave z-dimension profile.

18. The stack of claim 16, wherein the first, second, and third heights follow a convex z-dimension profile.

* * * * *